(12) United States Patent
Yu et al.

(10) Patent No.: US 9,570,586 B2
(45) Date of Patent: Feb. 14, 2017

(54) FABRICATION METHODS FACILITATING INTEGRATION OF DIFFERENT DEVICE ARCHITECTURES

(71) Applicant: GLOBALFOUNDRIES Inc., Grand Cayman (KY)

(72) Inventors: Hong Yu, Rexford, NY (US); Seong Yeol Mun, Watervliet, NY (US); Bingwu Liu, Ballston Spa, NY (US); Lun Zhao, Ballston Spa, NY (US); Richard J. Carter, Saratoga Springs, NY (US); Manfred Eller, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 281 days.

(21) Appl. No.: 14/084,756

(22) Filed: Nov. 20, 2013

(65) Prior Publication Data

US 2015/0140756 A1    May 21, 2015

(51) Int. Cl.
| | |
|---|---|
| *H01L 29/66* | (2006.01) |
| *H01L 27/088* | (2006.01) |
| *H01L 29/78* | (2006.01) |
| *H01L 21/8234* | (2006.01) |
| *H01L 21/84* | (2006.01) |
| *H01L 29/165* | (2006.01) |

(52) U.S. Cl.
CPC . *H01L 29/66795* (2013.01); *H01L 21/823431* (2013.01); *H01L 21/845* (2013.01); *H01L 29/66636* (2013.01); *H01L 29/7848* (2013.01); *H01L 29/165* (2013.01)

(58) Field of Classification Search
CPC .......... H01L 21/823431; H01L 21/845; H01L 29/165; H01L 29/66636; H01L 29/7848
See application file for complete search history.

(56) References Cited

U.S. PATENT DOCUMENTS

| | | | |
|---|---|---|---|
| 7,485,524 B2* | 2/2009 | Luo | H01L 29/66636 257/E21.431 |
| 9,142,643 B2* | 9/2015 | Cheng | H01L 29/66636 |
| 2008/0006854 A1* | 1/2008 | Luo | H01L 29/66636 257/288 |

(Continued)

*Primary Examiner* — Seahvosh Nikmanesh
(74) *Attorney, Agent, or Firm* — Heslin Rothenberg Farley & Mesiti P.C.; Nathan B. Davis

(57) ABSTRACT

Circuit fabrication methods are provided which include, for example: providing one or more gate structures disposed over a substrate structure, the substrate structure including a first region and a second region; forming a plurality of U-shaped cavities extending into the substrate structure in the first region and the second region thereof, where at least one first cavity of the plurality of U-shaped cavities is disposed adjacent in one gate structure in the first region; and expanding the at least one first cavity further into the substrate structure to at least partially undercut the one gate structure, without expanding at least one second cavity of the plurality of U-shaped cavities, where forming the plurality of U-shaped cavities facilitates fabricating the circuit structure. In one embodiment, the circuit structure includes first and second transistors, having different device architectures, the first transistor having a higher mobility characteristic than the second transistor.

19 Claims, 5 Drawing Sheets

(56) References Cited

U.S. PATENT DOCUMENTS

2013/0009216 A1* 1/2013 Tsai .................. H01L 21/82380
257/288
2014/0134818 A1* 5/2014 Cheng ............... H01L 29/66636
438/300
2014/0197493 A1* 7/2014 Tsai .................. H01L 21/82341
257/368

* cited by examiner

FABRICATION METHODS FACILITATING INTEGRATION OF DIFFERENT DEVICE ARCHITECTURES

FIELD OF THE INVENTION

The present invention relates to methods for facilitating fabrication of circuit structures, and more particularly, to methods for facilitating fabrication of circuit structures integrating multiple devices having different device architectures.

BACKGROUND OF THE INVENTION

Different semiconductor devices may have one or more different device characteristics, including, for example, power consumption levels, threshold voltages, performance characteristics, etc. Multiple different device architectures may provide optimization of one or more of these characteristics for devices intended to perform specific functions. For instance, one device architecture may optimize power consumption for devices providing, for example, storage or memory functions, and a different device architecture may optimize one or more performance characteristics for devices providing, for example, logic or arithmetic functions. A system using multiple discrete devices, having different device architectures, and optimized for different functions, may result in added complexity and cost. Therefore, it may be desirable to develop methods for integrating multiple devices having different device architectures into one circuit structure.

BRIEF SUMMARY

The shortcomings of the prior art are overcome, and additional advantages are provided, through the provision, in one aspect, of a method for facilitating fabricating a circuit structure. The facilitating fabricating includes: providing one or more gate structures disposed over a substrate structure, the substrate structure including a first region and a second region; forming a plurality of U-shaped cavities extending into the substrate structure in the first region and the second region thereof, wherein at least one first cavity of the plurality of U-shaped cavities is disposed adjacent to one gate structure of the one or more gate structures in the first region of the substrate structure and expanding the at least one first cavity further into the substrate structure to at least partially undercut the one gate structure, without expanding at least one second cavity of the plurality of U-shaped cavities, wherein forming the plurality of U-shaped cavities facilitates fabricating the circuit structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
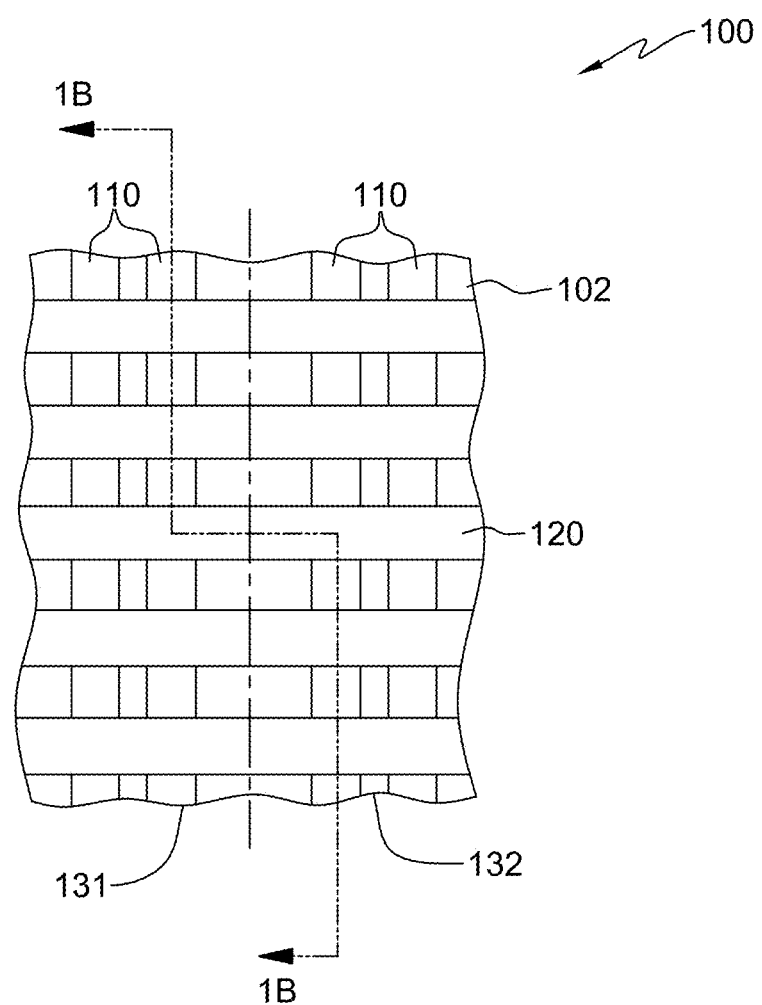
FIG. 1A is a plan view of one embodiment of a structure obtained during circuit structure fabrication, in accordance with one or more aspects of the present invention.

Aspects of the present invention and certain features, advantages, and details thereof, are explained more flatly below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

Disclosed herein, in part, are methods for integrating multiple devices having different functional characteristics into a single integrated circuit structure. As noted, different device architectures may be employed to optimize different devices to perform different functions. For example, logic devices, such as microprocessors, may be optimized for enhanced performance, including faster operating speeds, than, for example static random access memory (SRAM) devices. Thus, logic devices could benefit from a transistor device architecture using, for example, embedded sources or drains within cavities that undercut gate structures, to enhance speed through stress effects. However, SRAM devices may be optimized to minimize power consumption, or to reduce variability of threshold voltages ($V_{th}$) of the individual transistors, because SRAM devices include multiple latched transistors that may require nearly identical $V_{th}$ to function properly. SRAM devices may not benefit from a device architecture that increases speed, but may benefit from a different device architecture. As noted, such considerations may lead to complex, higher cost circuit designs using discrete components, each incorporating a different architecture optimized for a different function.

Therefore, an integrated circuit structure, such as a system-on-a-chip (SoC), integrating multiple different optimized devices, such as high performance logic devices and reduced $V_{th}$-variability SRAM devices, having different device architectures, would offer increased performance and lower complexity and cost than a system composed of multiple discrete components.

Generally stated, provided herein, in one aspect, is a method for facilitating fabricating a circuit structure. The facilitating fabricating includes: providing one or more gate structures disposed over a substrate structure, the substrate structure including a first region and a second region; forming a plurality of U-shaped cavities extending into the substrate structure in the first region and the second region thereof, wherein at least one first cavity of the plurality of U-shaped cavities is disposed adjacent to one gate-structure of the one or more gate structures in the first region of the substrate structure; and expanding the at least one first cavity further into the substrate structure to at least partially undercut the one gate structure, without expanding at least one second cavity of the plurality of U-shaped cavities, wherein forming the plurality of U-shaped cavities facilitates fabricating the circuit structure. In one example, the method could fluffier include, prior to expanding the at least one first cavity further into the substrate structure, providing a protective mask extending over the second region of the substrate structure, and, after expanding the at least one first cavity further into the substrate structure, removing the protective mask.

In one embodiment, expanding the at least one first cavity further into the substrate structure to at least partially undercut the one gate structure could include selectively etching the substrate structure at an angle laterally into the substrate structure below the one gate structure to facilitate defining an extended portion of the at least one first cavity. In such a case, the one gate structure could include a spacer layer, and the undercutting could include undercutting the spacer layer, wherein a thickness of the spacer layer of the one gate structure laterally limits the extended portion of the at least one first cavity below the one gate structure by blocking a portion of the selective etching from reaching below the one gate structure, in another example, forming the plurality of U-shaped cavities could include anisotropically etching the substrate structure adjacent to the one or more gate structures, wherein the anisotropic etching does not undercut the one or more gate structures.

In another embodiment, forming the plurality of U-shaped cavities extending into the substrate structure could further include forming the at least one second cavity adjacent to another gate structure of the one or more gate structures in the second region of the substrate structure. In such a case, the one gate structure and the another gate structure may be a common gate structure, the common gate structure being disposed adjacent to the at least one first cavity and the at least one second cavity. In one example, the one gate structure and the another gate structure could be different gate structures.

In a further embodiment, the method further may include providing a first circuit element and a second circuit element, the first circuit element being disposed at least partially within the at least one first cavity in the first region, including below the one gate structure, and the second circuit element being disposed at least partially within the at least one second cavity in the second region, adjacent to the another gate structure. In such a case, the circuit structure could include: a first transistor, the first transistor including the first circuit element and the one gate structure; and a second transistor, the second transistor including the second circuit element and the another gate structure, wherein the first transistor has a first mobility and the second transistor has a second mobility, the first mobility being greater than the Second mobility. As one example, the one gate structure and the another gate structure could be (or include) a common gate structure, the common gate structure connecting the first transistor and the second transistor and extending, at least partially, over the first region and the second region of the substrate structure.

In one embodiment, the first circuit element could apply a first stress on a portion of the substrate structure below the one gate structure and the second circuit element could apply a second stress on another portion of the substrate structure adjacent to the another gate structure, wherein the first stress is greater than the second stress. In another example, providing the first circuit element and the second circuit element may include epitaxially growing a material from at least one surface of the substrate structure within the at least one first cavity to form the first circuit element and epitaxially growing the material from at least one surface of the substrate structure within the at least one second cavity to form the second circuit element.

In another embodiment, the substrate structure may include at least one fin, the at least one fin at least partially underlying the one gate structure, and wherein forming the plurality of U-shaped cavities extending into the substrate structure could include forming the at least one first cavity in the at least one fin and forming the at least one second cavity in the at least one fin, and the expanding may be or include expanding the at least one first cavity further into the at least one fin to at least partially undercut the one gate structure. In one example, expanding the at least one first cavity further into the at least one fin further includes selectively etching downward into the at least one fin below the one gate structure to facilitate defining an extended portion of the at least one first cavity. In such an example, expanding the at least one first cavity further into the at least one fin further could include selectively etching the at least one fin downward into the at least one fin below the one gate structure to facilitate defining another portion of the at least one first cavity. In another example, the at least one fin also at least partially underlies another gate structure of the one or more gate structures in the second region, and the at least one second cavity is disposed adjacent to the another gate structure. In this case, in one example, the at least one fin could be for include) a common fin underlying both the one gate structure in the first region and the another gate structure in the second region. In a further example, the at least one fin could include an active layer, and forming the plurality of U-shaped cavities may further include forming the plurality of U-shaped cavities extending into the at least one fin for a majority of a thickness of the active layer of the at least one fin.

Reference is made below to the drawings, which are not drawn to scale for ease of understanding, wherein the same reference numbers used throughout different figures designate the same or similar components.

Figure 1B:
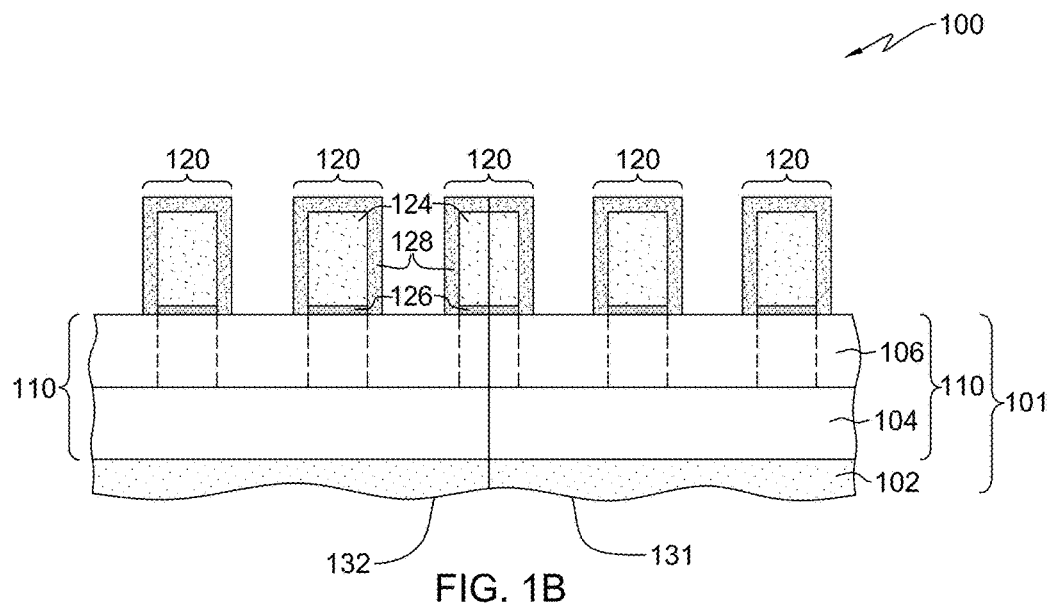
FIG. 1B is a split cross-sectional devotional view of the structure of FIG. 1A, taken along line 1B-1B thereof, illustrating one fin at least partially underlying one gate structure in a first region, and another fin at least partially underlying another gate structure in a second region, in accordance with one or more aspects of the present invention.

FIGS. 1A & 1B are a plan and elevational view, respectively, of one embodiment of an intermediate structure 100, obtained during a circuit fabrication process, in accordance with one or more aspects of the present invention, in this embodiment, one or more gate structures 120 are disposed over a substrate structure 101 (FIG. 1B), which may include a first region 131 and a second region 132, defined to facilitate fabrication of multiple devices having different device architectures within the different regions. Substrate structure 101 (FIG. 1B) may further include fins 110, extending from a substrate 102.

Substrate 102 may be (in one example) a bulk semiconductor material such as a bulk silicon wafer. As another example, substrate 102 may be or include any silicon-containing substrate including, but not limited to single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In one example, substrate 102 may be, for instance, a wafer or substrate approximately 600-700 micrometers thick, or less.

As noted, fins 110 extend from substrate 102, and may at least partially underlie the gates structures 120. The fins 110 may include one or more fins 110 in first region 131 and one or more fins 110 in second region 132. By way of example, fins 110 may be formed by removing one or more portions of substrate 102 to create the fins 110 from the same material as substrate 102, such as, for example, a semiconductor or crystalline material, in one example, formation of fins 110 may be achieved by patterning substrate 102 using any of various approaches, including: direct lithography; sidewall image transfer technique; extreme ultraviolet lithography (RN); e-beam technique; litho-etch litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins 110 may have a height of about 40 nanometers, and a length of about one micrometer, several micrometers, or the diameter of the entire wafer, and the thickness of fins 110 may be approximately 10 nanometers or less.

As noted gate structures 120 are disposed over substrate structure 101, including over multiple fins 110 in the illustrated embodiment, and may overlap fins 110 and substrate 102 in selected areas or regions. These gate structures may be or may facilitate formation of the gates of multiple fin-type transistors, such as one or more fin field-effect transistors (FinFETs). For instance, gate structures 120 may be or include sacrificial gate structures, such as polycrystalline silicon (polysilicon) sacrificial gates, which are to be removed and replaced with replacement metal gates as part of a gate-last fabrication process. Alternatively, the gate structures may be final gate structures formed, for instance, as part of a gate-first fabrication process. Gate structures 120, may be formed, using, for example, patterning, such as photolithographic patterning, followed by any suitable deposition process, such as atomic layer deposition (ALD), chemical vapor deposition (CVD), physical vapor deposition (PVD), or the like.

Using the circuit fabrication approach disclosed herein, structure 100 may include different types of devices, having different architectures, which are (in one embodiment) optimized to perform different functions. These different types of devices may include least one first transistor disposed in first region 131, and at least one second transistor disposed in second region 132. By way of example, the at least one first transistor may be designed or architected to operate as part of a logic device, and the at least one second transistor may be designed or architected to operate as part of a memory device, such as an SRAM. In such an example the first transistor may have a first mobility characteristic, and the second transistor may have a second mobility characteristic where the first mobility is greater than the second mobility, and therefore the first transistor may have a faster operating speed than the second transistor. Because typically the speed of logic devices, rather than the speed of memory devices, limits the computational performance, or the overall number of instructions per second that a circuit structure may be capable of performing, the circuit fabrication approach disclosed herein may increase computational performance of the circuit structure.

FIG. 1B is a split cross-sectional elevational view of the structure of FIG. 1A, taken along line 1B-1B thereof. Depicted in this split view is one example of a fin underlying one or more gate structures 120 in first region 131, and pursuant to the example of FIG. 1A, a different fin at least partially underlying one or more gate structures 120 in second region 132.

In one embodiment, fins 110 of FIG. 1B may include an active layer 106 overlying an isolation layer 104. Active layer 106 may facilitate defining, for instance, a channel region of a FinFET. By way of example, active layer 106 may be the same material as substrate 102, such as a semiconductor material, and in other examples, active layer 106 and substrate 102 may be different materials, or may be semiconductor materials having different dopants or different dopant concentrations. As a specific example, the thickness of active layer 106 may be between, for instance, 10 nanometers and 60 nanometers. Isolation layer 104 may be a passive layer, or insulator layer, provided (for instance) to prevent leakage of current into substrate 102. Isolation layer 104 may include, for example, an oxide, such as silicon dioxide, or a high dielectric constant (high-k) material, and may, depending on the desired circuit design, have a thickness of between 1 and 100 nanometers.

In one example, such as in a gate-first fabrication process, gate structures 120 may include gate metals 124 separated from fins 110 by one or more gate dielectric layers 126, and may have spacer layers 128. Gate metals 124 may include, for example, multiple layers of material, such as one or more layers of one or more metals. Spacer layers 128, which may be, for example, thin film layers formed along the sidewalls of gate metals 124, and optionally over the gate metals, may be deposited using conventional deposition processes, such as, for example, CVD, low-pressure CVD, or plasma-assisted CVD (PE-CVD), and may be fabricated of a material such as, for example, silicon nitride. In a specific example, silicon nitride spacer layers 12g may be deposited using process gases such as, fir example, dichlorosilane ($SiH_2Cl_2$) and ammonia ($NH_3$) and known process conditions. As one specific example, gate metals 124, gate oxides 126, and semiconductor active regions 106 of fins 110 may taken together be the metal, oxide, and semiconductor of metal-oxide-semiconductor field effect transistor (MOSFET), such as, for example, FinFETs.

Figure 1C:
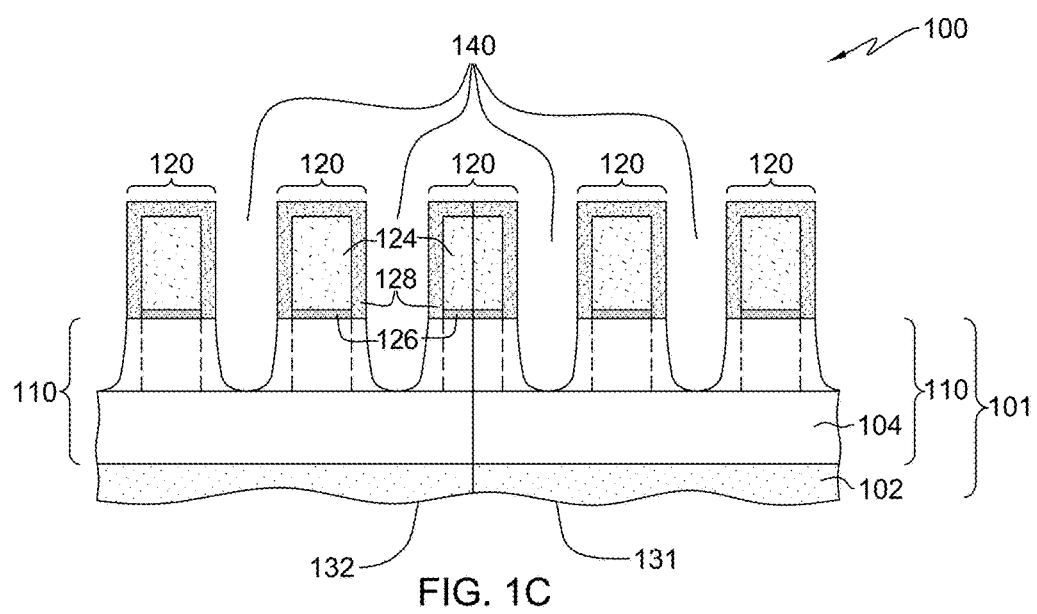
FIG. 1C depicts the structure of FIG. 1B after forming a plurality of U-shaped cavities extending into the substrate structure in the first region and the second region thereof, in accordance with one or more aspects of the present invention.

FIG. 1C illustrates the structure of FIG. 1B after forming a plurality of U-shaped cavities 110 extending into substrate structure 101 in first region 131 and second region 132. U-shaped cavities 140 may be initially similarly sized and configured, and include a first cavity disposed adjacent to one or more gate structures in first region 131, and a second cavity disposed adjacent to one or more gate structures in second region 132.

The plurality of U-shaped cavities 140 may be formed by, for instance, anisotropically etching substrate structure 101 adjacent to gate structures 120. The anisotropic etching is chosen so as to not undercut gate structures 120, yielding similar U-shaped cavities 140 that do not undercut gate structures 120, U-shaped cavities 140 may have a U-shape as a result of the anisotropic etching process, such as anisotropic RIE, because anisotropic etching tends to prefer specific directions, providing higher vertical directionality than lateral directionality, rather than removing material equally in all directions.

In one example, fins 110 could include active layer 106, and forming the shaped cavities 140 could further include configuring and sizing the cavities extending into fins 110 for, for instance, a majority of a thickness of active layer 106 of fins 110, allowing for a later formed circuit element 160 (see FIG. 1G) to exert a stress along a majority of the thickness of active layer 106, which may be an appropriate architectural choice for a high speed device. In other examples, the U-shaped cavities 140 may extend into isolation layers 104 of fins 110, or, U-shaped cavities 140 may be confined to active layers 106 of fins 110, depending on the desired functionality of the device being formed, and the amount of stress that may be appropriate.

In another example, spacer layers 128 may be or include a material impervious to the etching chemistry employed, and therefore may serve as an etch-mask, limiting or defining the shape of U-shaped cavities 140, to between adjacent gate structures and not underlying gate structures 120. In the depicted example, fins 110 underlie gate structures 120 and extend perpendicular to gate structures 120. Thus, a single etching step, using spacer layers. 128, and, for example, another mask protecting exposed regions of substrate 102, may be used to form a regular grid of U-shaped cavities 120 within the structure between gate structures 120. In a further example, one or more regions of structure 100 may be protected with a protective mask, to, for example, facilitate formation of devices without U-shaped cavities. For example, a mask may protect a region of circuit structure 100 intended to contain, for example, n-type devices, and U-shaped cavities may be formed to facilitate formation of p-type devices.

Anisotropic RIE processing may be performed using reactant gases along with a carrier gas with a high molecular weight, such as argon, at high source power and high chuck bias power, enhancing the physical component of the RIE and causing the chemical component to become more directional. For example, anisotropic etching may be or include plasma etching, using gases highly reactive to the material of fins 110, such tetrafluoromethane ($CF_4$), sulfur hexafluoride ($SF_6$), boron chloride, ($BCl_3$), or nitrogentrifluoride ($NF_3$) with process parameters tuned to yield isotropic etching of fins 110.

Figure 1D:
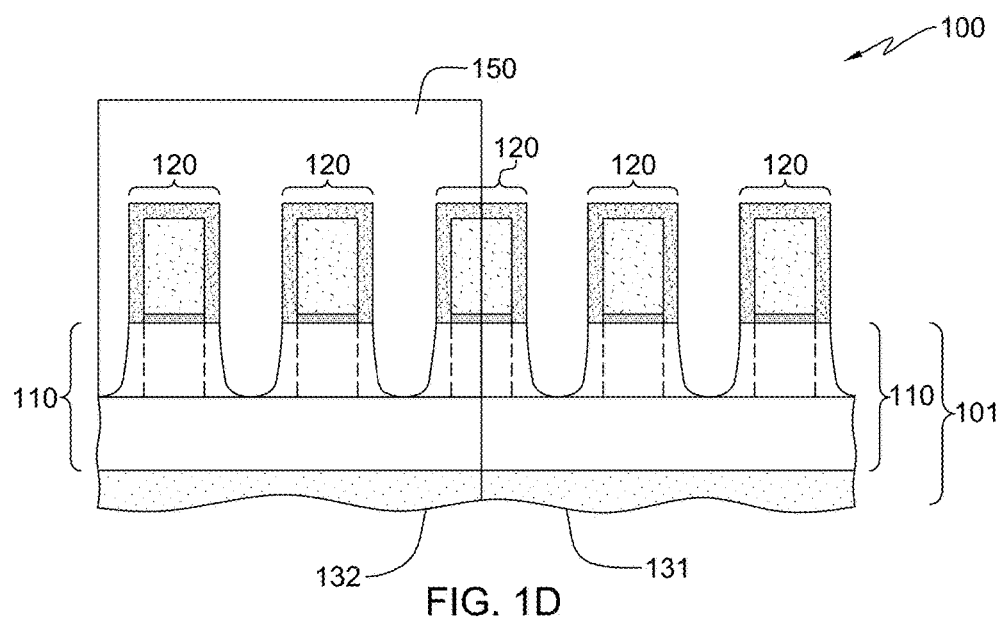
FIG. 1D depicts the structure of FIG. 1C after providing a protective mask extending over the second region of the substrate structure, in accordance with one or more aspects of the present invention.

FIG. 1D illustrates the structure of FIG. 1C after providing a protective mask 150 extending over second region 132 of substrate structure 101. As depicted, protective mask 150 serves to protect cavities in second region 132, during subsequent processing of cavities in first region 131 one embodiment of which is described below with respect to FIG. 1E. For instance, this subsequent processing may be to facilitate, for example, fabrication of devices in first region 131 having an architecture optimized for one function or use, and devices in second region 132 having a different architecture optimized for a different function or use.

In one embodiment, protective mask 150 may be, for instance, an organic planarization layer (OPL) such as a siloxane-based material, and may have a thickness of (for example) 50 to 100 nanometers. Such a protective mask 150 could be deposited using a variety of techniques, including spin-on deposition.

Figure 1E:
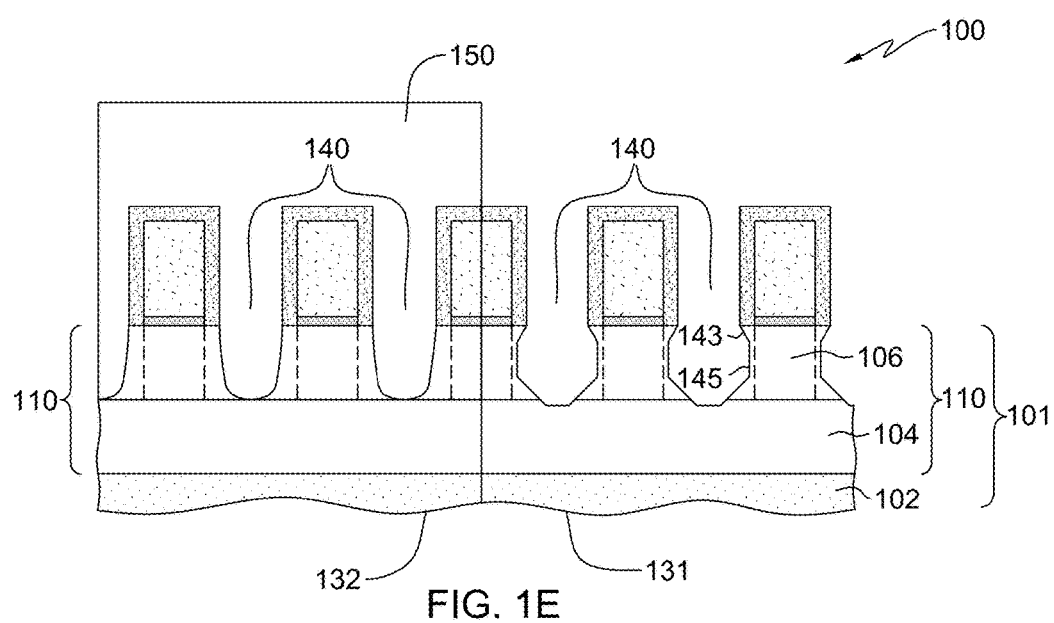
FIG. 1E depicts the structure of FIG. 1D after expanding multiple first cavities further into the substrate structure to at least partially undercut the adjacent gate structures, in accordance with one or more aspects of the present invention.

FIG. 1E illustrates the structure of FIG. 1D after expanding one or more first cavities in first region 131 further into substrate structure 101, and in particular, to at least partially undercut adjacent gate structures 120, without having expanded one or more second cavities in second region 132. By expanding such first cavities without expanding the second cavities, the resultant devices in first region 131 may be configured with one device architecture, and resultant devices in second region 132 may have another device architecture, for instance, after forming sources/drains in the different cavities.

In the illustrated example, expanding the first cavities in first region 131 further into fins 110 (or substrate structure 101) may include selectively etching, through the first cavities, the exposed fins 110 at an angle laterally into the fins below gate structures 120 to facilitate defining extended portions of the first cavities. This selective etching process may advantageously yield first cavities with close lateral proximity to transistor channel regions located below the respective gate structures 120, and thereby facilitate provision of stress elements close to the channel regions. See in this regard, the later-formed circuit elements 160 (see FIG. 1G).

Note that, the first cavities could be expanded further into fins 110 by also selectively etching fins 110 downward into fins 110 below gate structures 120 to facilitate defining the extended portions of the first cavities. This further selective etching process may advantageous yield first cavities extending deeper into the exposed fins 110, for example, for a majority of the thickness of active layers 106. This extended depth of the cavities below the gate structures facilitates application of stress along a greater depth of fins 110, such as a majority of the thickness of active layer(s) 106 (which may include the channel region(s) of one or more transistor(s)), by the later-formed circuit elements 160 (see FIG. 1G).

The selective etching processes described herein may include anisotropic etching, such as wet etching, with chemicals that naturally prefer, select, or reveal, certain crystal planes. For example, wet etching may include etching with potassium hydroxide (KOH), tetra-methyl-ammonium hydroxide (TMAH), or any other suitable etchant. In one example, an additional step of etching, such as isotropic RIE, may be performed prior to wet etching, to serve as a starting point for the subsequent wet etching. In another example, the selective etching process parameters may be tuned to etch along a selected crystal direction, such as selected planes of crystal lattices of fins 110, up to 5 to 100 times faster than along other crystal directions. In one example, upper surfaces of fins 110 may be {100} planes, and selectively etching fins 110 at an angle laterally into fins 110 below gate structures 120 may reveal {111} planes 143 of fins 110. In another example, selectively etching fins 110 downward into fins 110 below gate structures 120 may reveal {110} planes 145 of fins 110. The first cavities may share certain similarities with a so-called sigma cavity, which is named for the resemblance between the Greek-letter Σ (Sigma) and the profile of its angular planes, because the first cavities, like sigma cavities may have intersecting {111}, {110}, and {100} planes. (Note that the symbol {xyz} denotes the Miller index for the set of equivalent crystal planes.)

Spacer layers 128 of gate structures 120, which may be impervious to the selective etching process, may facilitate providing specific configurations and sizes of first cavities below gate structures 120, for instance, to meet desired architectural or performance requirements. Spacer layers 128 may facilitate specific configurations and sizes because the selective etching process may be naturally self-limited, and may slow down, or stop, after exposure of a desired crystal plane. Therefore, specified thicknesses of spacer layers 128 could determine the starting point of the selective etching, and thereby control the final position of planes of the first cavities, as well as self-aligning the first cavities to have optimal proximity to the channel regions within fins 110, and thereby allow optimal stress to be applied to the channel region(s) by the later-formed circuit elements provided therein.

Figure 1F:
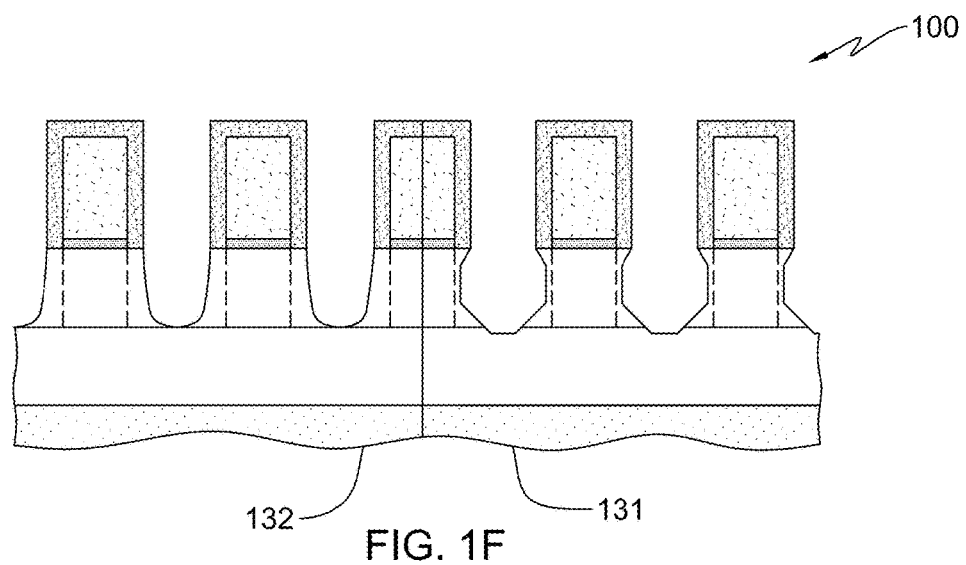
FIG. 1F depicts the structure of FIG. 1E after removing the protective mask over the second region thereof, in accordance with one or more aspects of the present invention.

FIG. 1F illustrates the structure of FIG. 1E after removal of protective mask 150 (see FIG. 1E) from overlying second region 132. Removal of protective mask 150 may be accomplished using a wet or dry etching process, such as by a dilute hydrofluoric (HF) acid bath of for instance, 0.5%-5%, or a solvent based on alcohol, at a concentration ratio that would not remove, for example other portions of structure 100. After removing protective mask 150, fabrication processing common to devices of one architecture in first region 131 and devices of another architecture in second region 132 may be concurrently and/or sequentially performed on structure 100.

Figure 1G:
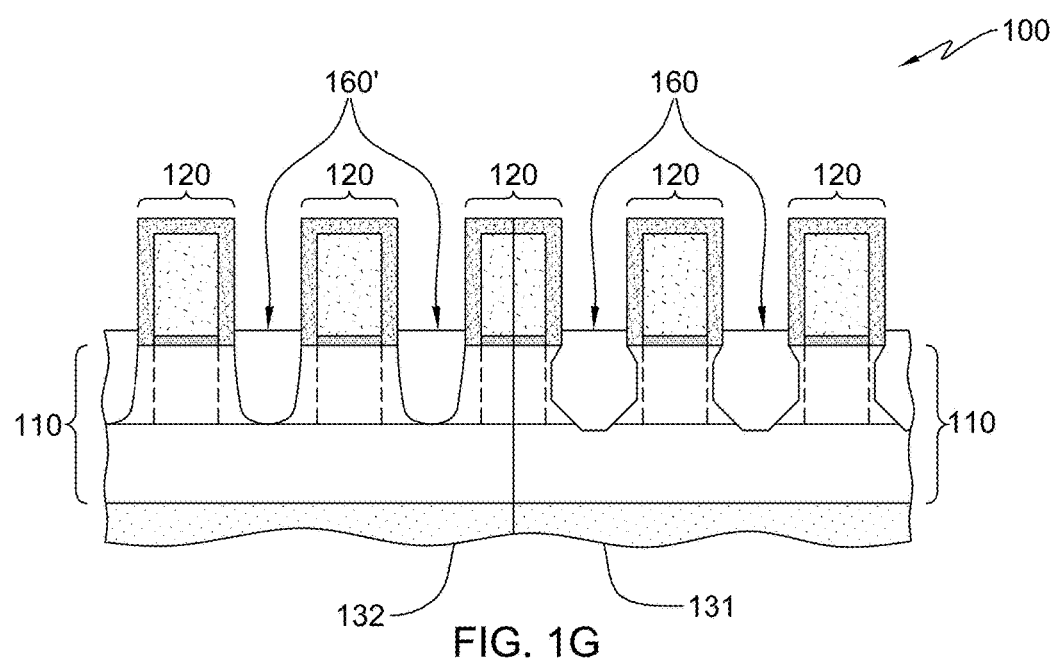
FIG. 1G depicts the structure of FIG. 1F after providing first circuit elements and second circuit elements within the structure, in accordance with one or more aspects of the present invention.

FIG. 1G illustrates the structure of FIG. 1F after providing at least one first circuit element 160 and at least one second circuit element 160' within the cavities. As depicted, in one example, first circuit elements 160 are disposed at least partially within the first cavities in first region 131, including below the respective gate structures 120, and second circuit elements 160' are disposed at least partially within the second cavities in second region 132, adjacent to respective gate structures 120.

The differently configured and sized circuit elements 160, 160', may be sources or drains of different transistors, and may apply different stresses to channel regions of the different transistors, thereby facilitating the different transistors having different device characteristics. For example, different applied stresses may change the mobility of charge carriers within the channel regions. As known, the mobility of charge carriers, including electrons and holes in semiconductors, characterizes how quickly a charge carrier can move when pulled by an electric field, and directly impacts the switching speed and current of for example, the transistors.

Circuit elements 160, 160' may be provided, for instance, by epitaxially growing material, such as, for example, silicon germanium, from at least one surface of substrate structure 101, including from exposed fin surfaces within the first and second cavities. For example, epitaxial growth within the first cavities may occur from revealed planar surfaces such as {111} planes 143 or {110} planes 145 (see FIG. 1E). In one example, a single process of epitaxial growth may be employed to simultaneously provide first circuit elements 160 and second circuit elements 160', and in another example, two separate processes of epitaxial growth may be employed. Epitaxial growth may be achieved using various methods, such as, for example, CVD, low-pressure CVD (LPCVD), or other applicable methods.

Circuit elements 160, 160' may apply stresses on adjacent fin regions, because the circuit elements may include a material having the same crystal structure, but a different lattice constant, than the material of fins 110. This is because epitaxially grown circuit elements 160, 160', having the same crystal structure as fins 110, may conform to the crystal structure of fins 110, despite the difference in lattice constants. However, because of the difference in lattice constants, circuit elements 160, 160' may tightly or loosely fill the cavities, thereby applying a compressive or tensile stress, respectively. The stress may be selected to be a compressive stress or a tensile stress, depending on the type of transistor being fabricated, and may differ based the overall size and configuration, including any angular planes, of the circuit elements. For example, compressive stress may increase carrier mobility for p-type transistors and tensile stress may increase carrier mobility for n-type transistors. In one example, where fins 110 are or include silicon fins, silicon germanium (SiGe), with, for example, 10-50% germanium doping, may be used to achieve compressive stress, and silicon carbon (SIC) or silicon phosphide (SIP), with, for example, 0.1-10% doping, may be used to achieve tensile stress.

In one example, first circuit element 160 in first region 131 and second circuit element 160' in second region 132 may be disposed adjacent to a common gate structure, such as the central gate structure depicted in FIG. 1G. In such an example, the common gate structure may electrically connect a first transistor associated with first circuit element 160 with a second transistor associated with second circuit element 160', thereby integrating multiple devices having different device architecture within structure 100.

Figure 2A:
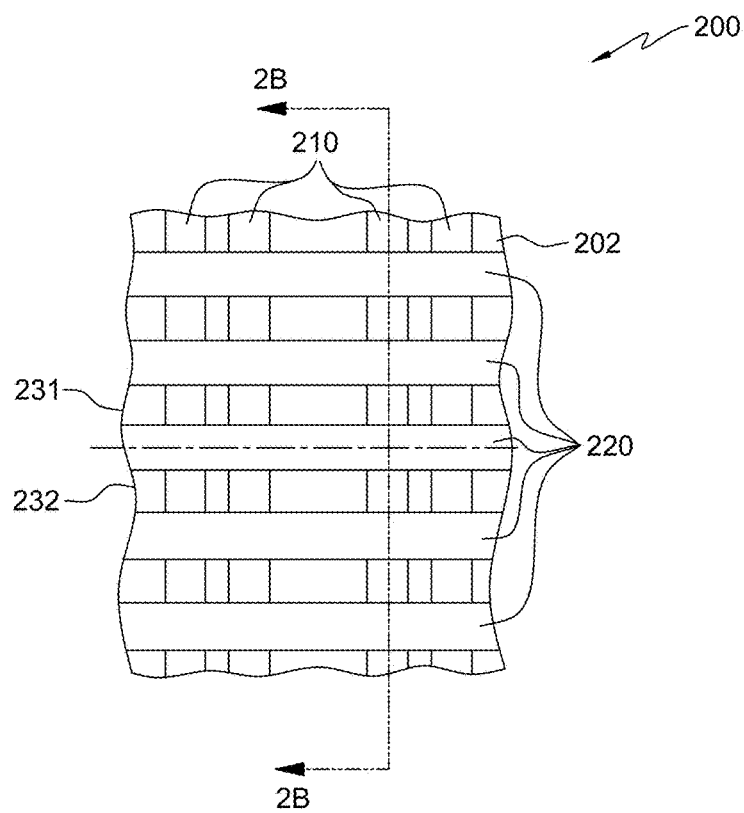
FIG. 2A is a plan view of another embodiment of a structure obtained during circuit structure fabrication, in accordance with one or more aspects of the present invention.

FIG. 2A is a plan view of another embodiment of an intermediate structure 200, obtained during a circuit fabrication process, in accordance with one or more aspects of the present invention. By contrast with FIG. 1A, this embodiment depicts structure 200 divided into a first region 231 and a second region 232, such that a common fin 210 extends over the two regions.

Figure 2B:
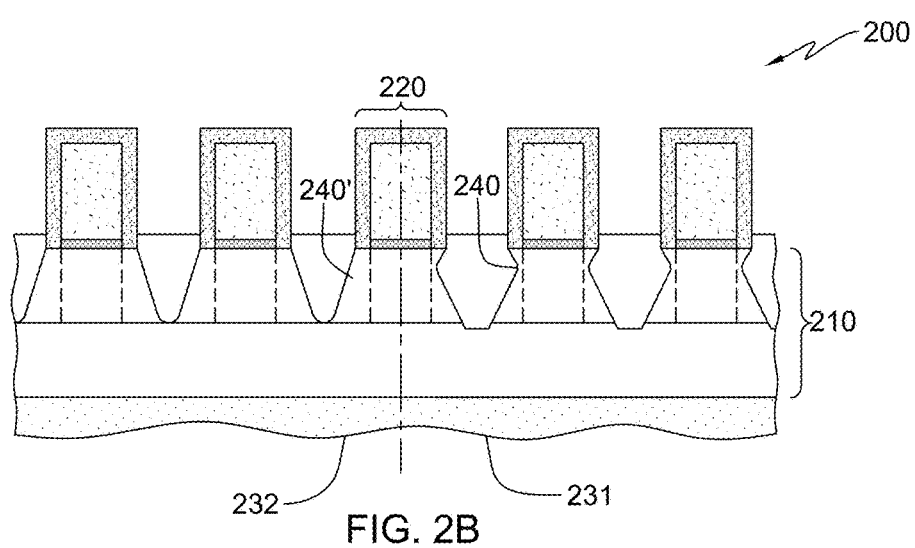
FIG. 2B is a cross-sectional elevational view of the structure of FIG. 2A, taken along line 2B-2B thereof, and illustrates the circuit structure after further fabrication processing thereof to form different cavities in different regions of the structure and in a common fin underlying both one gate structure in a first region and another gate structure in a second region, in accordance with one or more aspects of the present invention.

FIG. 2B is a cross-sectional elevational view of the structure of FIG. 2A, taken along line 2B-2B thereof. In the illustrated example, fabrication processing, as described above with respect to FIGS. 1A-1G, has been performed on structure 200, to form first cavities 240 in first region 231 of common fin 210 and second cavities 240' in second region 232 of common fin 210. As depicted, common fin 210 may at least partially underlie a gate structure 220 in first region 231, and may at least partially underlie another gate structure 220 in second region 232, facilitating fabrication of multiple devices having different device architectures in the different regions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking, verbs.

As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has." "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   facilitating fabricating a circuit structure, the facilitating comprising:
   providing one or more gate structures disposed over a substrate structure, the substrate structure comprising a first region and a second region;
   forming a plurality of U-shaped cavities extending into the substrate structure in the first region and the second region thereof, wherein at least one first cavity of the plurality of U-shaped cavities is disposed adjacent to one gate structure of the one or more gate structures in the first region of the substrate structure;
   providing a protective mask extending over the second region of the substrate structure, the first region of the substrate and the second region of the substrate being on a shared chip and configured for different device characteristics;
   expanding the at least one first cavity further into the substrate structure to at least partially undercut the one gate structure, without expanding at least one second cavity of the plurality of U-shaped cavities, wherein forming the plurality of U-shaped cavities facilitates fabricating the circuit structure; and
   removing the protective mask.

2. The method of claim 1, wherein expanding the at least one first cavity further into the substrate structure to at least partially undercut the one gate structure comprises selectively etching the substrate structure at an angle laterally into the substrate structure below the one gate structure to facilitate defining an extended portion of the at least one first cavity.

3. The method of claim 2, wherein the one gate structure comprises a spacer layer, and the undercutting comprises undercutting the spacer layer, wherein a thickness of the spacer layer of the one gate structure laterally limits the extended portion of the at least one first cavity below the one gate structure by blocking a portion of the selective etching from reaching below the one gate structure.

4. The method of claim 1, wherein forming the plurality of U-shaped cavities comprises anisotropically etching the substrate structure adjacent to the one or more gate structures, wherein the anisotropic etching does not undercut the one or more gate structures.

5. The method of claim 1, wherein forming the plurality of U-shaped cavities extending into the substrate structure further comprises forming the at least one second cavity adjacent to another gate structure of the one or more gate structures in the second region of the substrate structure.

6. The method of claim 5, wherein the one gate structure and the another gate structure comprise a common gate structure, the common gate structure being disposed adjacent to the at least one first cavity and the at least one second cavity.

7. The method of claim 5, wherein the one gate structure and the another gate structure are different gate structures.

8. The method of claim 5, wherein the method further comprises providing a first circuit element and a second circuit element, the first circuit element being disposed at least partially within the at least one first cavity in the first region, including below the one gate structure, and the second circuit element being disposed at least partially within the at least one second cavity in the second region, adjacent to the another gate structure.

9. The method of claim 8, wherein the circuit structure comprises:
   a first transistor, the first transistor comprising the first circuit element and the one gate structure; and
   a second transistor, the second transistor comprising the second circuit element and the another gate structure, wherein the first transistor has a first mobility and the second transistor has a second mobility, the first mobility being greater than the second mobility.

10. The method of claim 9, wherein the one gate structure and the another gate structure are a common gate structure, connecting the first transistor and the second transistor, and extending, at least partially, over the first region and the second region of the substrate structure.

11. The method of claim 8, wherein the first circuit element applies a first stress on a portion of the substrate structure below the one gate structure and the second circuit element applies a second stress on another portion of the substrate structure adjacent to the another gate structure, wherein the first stress is greater than the second stress.

12. The method of claim 8, wherein providing the first circuit element and the second circuit element comprises epitaxially growing a material from at least one surface of the substrate structure within the at least one first cavity to form the first circuit element and epitaxially growing the material from at least one surface of the substrate structure within the at least one second cavity to form the second circuit element.

13. The method of claim 1, wherein the substrate structure comprises at least one fin, the at least one fin at least partially underlying the one gate structure, and wherein forming the plurality of U-shaped cavities extending into the substrate structure comprises forming the at least one first cavity in the at least one fin and forming the at least one second cavity in the at least one fin, and the expanding comprises expanding the at least one first cavity further into the at least one fin to at least partially undercut the one gate structure.

14. The method of claim 13, wherein expanding the at least one first cavity further into the at least one fin to at least partially undercut the one gate structure comprises selectively etching at an angle laterally into the at least one fin below the one gate structure to facilitate defining an extended portion of the at least one first cavity.

15. The method of claim 14, wherein expanding the at least one first cavity further into the at least one fin further comprises selectively etching the at least one fin downward into the at least one fin below the one gate structure to facilitate defining the extended portion of the at least one first cavity.

16. The method of claim 13, wherein the at least one fin also at least partially underlies another gate structure of the one or more gate structures in the second region, and the at least one second cavity is disposed adjacent to the another gate structure.

17. The method of claim 16, wherein the at least one fin comprises a common fin underlying both the one gate structure in the first region and the another gate structure in the second region.

18. The method of claim 16, wherein the one gate structure and the another gate structure comprise a common gate structure, the common gate structure being disposed adjacent to the at least one first cavity and the at least one second cavity.

19. The method of claim 13, wherein the at least one fin comprises an active layer, and forming the plurality of U-shaped cavities further comprises forming the plurality of U-shaped cavities extending into the at least one fin for a majority of a thickness of the active layer of the at least one fin.

* * * * *